United States Patent
Liggiero

(10) Patent No.: US 9,152,747 B2
(45) Date of Patent: Oct. 6, 2015

(54) DISTORTION MEASUREMENT AND CORRECTION SYSTEM AND METHOD

(71) Applicant: LTX-Credence Corporation, Norwood, MA (US)

(72) Inventor: Richard Liggiero, Tewksbury, MA (US)

(73) Assignee: Xcerra Corporation, Boston, MA (US)

( * ) Notice: Subject to any disclaimer, the term of this patent is extended or adjusted under 35 U.S.C. 154(b) by 0 days.

(21) Appl. No.: 14/452,949

(22) Filed: Aug. 6, 2014

(65) Prior Publication Data

US 2015/0042402 A1 Feb. 12, 2015

Related U.S. Application Data

(60) Provisional application No. 61/863,618, filed on Aug. 8, 2013.

(51) Int. Cl.
| | |
|---|---|
| *G01R 13/00* | (2006.01) |
| *G06F 17/50* | (2006.01) |
| *G01R 27/28* | (2006.01) |
| *H03H 7/065* | (2006.01) |
| *H03H 11/12* | (2006.01) |
| *H03M 1/00* | (2006.01) |
| *H03H 11/04* | (2006.01) |
| *H03H 11/32* | (2006.01) |
| *H03H 7/01* | (2006.01) |

(52) U.S. Cl.
CPC ............ *G06F 17/5009* (2013.01); *G01R 27/28* (2013.01); *G06F 17/5036* (2013.01); *H03H 7/065* (2013.01); *H03H 11/1295* (2013.01); *H03M 1/00* (2013.01); *H03H 11/32* (2013.01); *H03H 2007/013* (2013.01); *H03H 2011/0488* (2013.01)

(58) Field of Classification Search
USPC ................ 702/1–84; 327/113–122, 355–361; 377/47, 48; 455/323–330
See application file for complete search history.

(56) References Cited

U.S. PATENT DOCUMENTS

| | | |
|---|---|---|
| 7,664,621 B2 | 2/2010 | Liggiero, III et al. |
| 7,919,968 B2 | 4/2011 | Max |
| 7,957,924 B2 | 6/2011 | Liggiero, III et al. |

*Primary Examiner* — Brandon S Cole

(74) *Attorney, Agent, or Firm* — Brian J. Colandreo; Jeffrey T. Placker; Holland & Knight LLP

(57) ABSTRACT

A method, computer program product, and computer system for determining a magnitude and phase of a spurious-free dynamic range component. A first signal and a second signal may be received from a first source operatively connected to a differential component. A first output associated with the first signal and a second output associated with the second signal may be nulled. The first signal and the second signal may be shorted. A second source operatively connected to the differential component may be disconnected. The first signal of the first source may be applied at a same phase as the second source with an additional phase delta, $+Y°$. A first differential residual signal may be measured using the first signal at the same phase as the second source with the additional phase delta, $+Y°$. The second signal of the first source may be applied at the same phase as the second source with an additional phase delta, $-Y°$. A second differential residual signal may be measured using the second signal at the same phase as the second source with the additional phase delta, $-Y°$. The magnitude and phase of the distortion component of the first source may be determined based upon, at least in part, the first and second differential residual signal.

24 Claims, 21 Drawing Sheets

DISTORTION MEASUREMENT AND CORRECTION SYSTEM AND METHOD

RELATED CASES

This application claims the benefit of U.S. Provisional Application No. 61/863,618, filed on 8 Aug. 2013, by Richard Liggiero, the contents of which are all incorporated by reference.

BACKGROUND

To perform distortion correction of a given resource, one may take care when measuring, isolating, and determining the magnitude and phase of each distortion component. This may be to adequately "pre-distort" the source tone accordingly, as to cancel out or correct for the respective distortion products. An example method, in conjunction with, e.g., the DCTM (LTX-Credence) design architecture, may be capable of industry performance levels of better than −140 dBc THD across the effective bandwidth (BW) of the dynamic source, 50 kHz. The process and method has been leveraged across other signal source resources as well, such as the HSB (LTX-Credence instrumentation), to provide equivalent performance improvements over a wider frequency range. Unfortunately, as is the case in the past, the need for a notch filter is generally required, since, e.g., the distortion products of the measurement system may ultimately corrupt the ability to determine the true content of the distortion components of the dynamic source itself. While still effective, the use of the notch filter and its design may limit the capability to that frequency.

BRIEF SUMMARY OF DISCLOSURE

In one implementation, a method for determining a magnitude and phase of a distortion component, performed by one or more computing devices, may include but is not limited to receiving, by a computing device, a first signal and a second signal from a first source operatively connected to a differential component. A first output associated with the first signal and a second output associated with the second signal may be nulled. The first signal and the second signal may be shorted. A second source operatively connected to the differential component may be disconnected. The first signal of the first source may be applied at a same phase as the second source with an additional phase delta, $+Y°$. A first differential residual signal may be measured using the first signal at the same phase as the second source with the additional phase delta, $+Y°$. The second signal of the first source may be applied at the same phase as the second source with an additional phase delta, $-Y°$. A second differential residual signal may be measured using the second signal at the same phase as the second source with the additional phase delta, $-Y°$. The magnitude and phase of the distortion component of the first source may be determined based upon, at least in part, the first and second differential residual signal.

One or more of the following features may be included. The magnitude and phase of the distortion component may be determined without a notch filter. At least one of the first source and the second source may be at least one of a true differential, a pseudo differential, and a single ended configuration. The second source may be disconnected by opening one or more relays. The first signal and the second signal may be shorted by closing one or more relays. Nulling the first output and the second output may include setting an amplitude of the first signal and the second signal relative to an amplitude of the second source. The magnitude of the distortion component may remain constant while the phase of the distortion component may move according to its position with respect to the second signal. At least one of the first source and the second source may include at least one of an input source and a nulling source.

In another implementation, a computing system includes a processor and a memory configured to perform operations for determining a magnitude and phase of a distortion component that may include but are not limited to receiving a first signal and a second signal from a first source operatively connected to a differential component. A first output associated with the first signal and a second output associated with the second signal may be nulled. The first signal and the second signal may be shorted. A second source operatively connected to the differential component may be disconnected. The first signal of the first source may be applied at a same phase as the second source with an additional phase delta, $+Y°$. A first differential residual signal may be measured using the first signal at the same phase as the second source with the additional phase delta, $+Y°$. The second signal of the first source may be applied at the same phase as the second source with an additional phase delta, $-Y°$. A second differential residual signal may be measured using the second signal at the same phase as the second source with the additional phase delta, $-Y°$. The magnitude and phase of the distortion component of the first source may be determined based upon, at least in part, the first and second differential residual signal.

One or more of the following features may be included. The magnitude and phase of the distortion component may be determined without a notch filter. At least one of the first source and the second source may be at least one of a true differential, a pseudo differential, and a single ended configuration. The second source may be disconnected by opening one or more relays. The first signal and the second signal may be shorted by closing one or more relays. Nulling the first output and the second output may include setting an amplitude of the first signal and the second signal relative to an amplitude of the second source. The magnitude of the distortion component may remain constant while the phase of the distortion component may move according to its position with respect to the second signal. At least one of the first source and the second source may include at least one of an input source and a nulling source.

In another implementation, a computer program product resides on a computer readable storage medium that has a plurality of instructions stored on it. When executed by a processor, the instructions cause the processor to perform operations for determining a magnitude and phase of a distortion component that may include but are not limited to receiving a first signal and a second signal from a first source operatively connected to a differential component. A first output associated with the first signal and a second output associated with the second signal may be nulled. The first signal and the second signal may be shorted. A second source operatively connected to the differential component may be disconnected. The first signal of the first source may be applied at a same phase as the second source with an additional phase delta, $+Y°$. A first differential residual signal may be measured using the first signal at the same phase as the second source with the additional phase delta, $+Y°$. The second signal of the first source may be applied at the same phase as the second source with an additional phase delta, $-Y°$. A second differential residual signal may be measured using the second signal at the same phase as the second source with the additional phase delta, $-Y°$. The magnitude and phase of the distortion component of the first source may be determined based upon, at least in part, the first and second differential residual signal.

One or more of the following features may be included. The magnitude and phase of the distortion component may be determined without a notch filter. At least one of the first source and the second source may be at least one of a true differential, a pseudo differential, and a single ended configuration. The second source may be disconnected by opening one or more relays. The first signal and the second signal may be shorted by closing one or more relays. Nulling the first output and the second output may include setting an amplitude of the first signal and the second signal relative to an amplitude of the second source. The magnitude of the distortion component may remain constant while the phase of the distortion component may move according to its position with respect to the second signal. At least one of the first source and the second source may include at least one of an input source and a nulling source.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION

Figure 1:
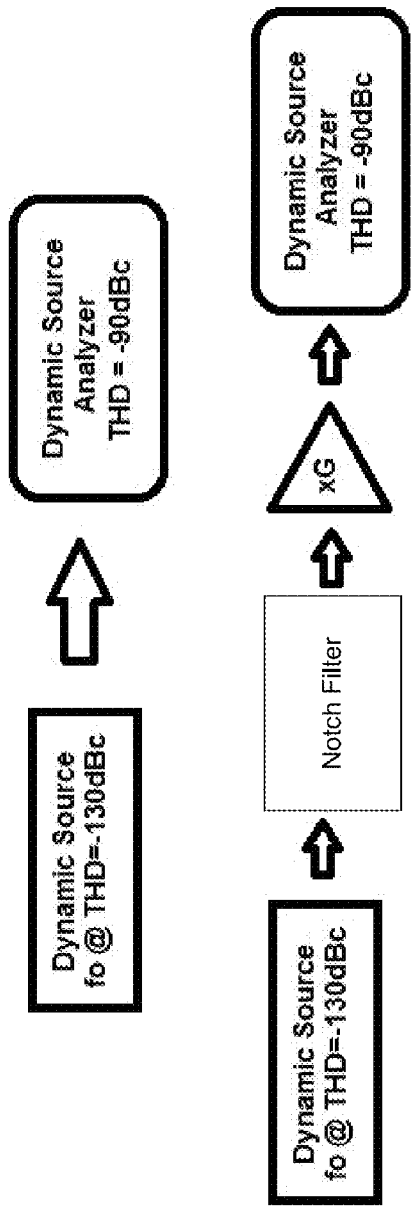
FIG. 1 is an illustrative diagrammatic view of an example configuration of an distortion/Harmonic test setup according to one or more implementations of the present disclosure.

System Overview:

As will be appreciated by one skilled in the art, the present disclosure may be embodied as a method, system, or computer program product. Accordingly, the present disclosure may take the form of an entirely hardware implementation, an entirely software implementation (including firmware, resident software, micro-code, etc.) or an implementation combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium (or media) may be utilized. The computer readable medium may be a computer readable signal medium or a computer readable storage medium. The computer-usable, or computer-readable, storage medium (including a storage device associated with a computing device or client electronic device) may be, for example, but is not limited to, an electronic, magnetic, optical, electromagnetic, infrared, or semiconductor system, apparatus, device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a digital versatile disk (DVD), a static random access memory (SRAM), a memory stick, a floppy disk, a mechanically encoded device such as punch-cards or raised structures in a groove having instructions recorded thereon, a media such as those supporting the internet or an intranet, or a magnetic storage device. Note that the computer-usable or computer-readable medium could even be a suitable medium upon which the program is stored, scanned, compiled, interpreted, or otherwise processed in a suitable manner, if necessary, and then stored in a computer memory. In the context of the present disclosure, a computer-usable or computer-readable, storage medium may be any tangible medium that can contain or store a program for use by or in connection with the instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. The computer readable program code may be transmitted using any appropriate medium, including but not limited to the internet, wireline, optical fiber cable, RF, etc. A computer readable signal medium may be any computer readable medium that is not a computer readable storage medium and that can communicate, propagate, or transport a program for use by or in connection with an instruction execution system, apparatus, or device.

Computer program code for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java®, Smalltalk, C++ or the like. Java and all Java-based trademarks and logos are trademarks or registered trademarks of Oracle and/or its affiliates. However, the computer program code for carrying out operations of the present disclosure may also be written in conventional procedural programming languages, such as the "C" programming language, PASCAL, or similar programming languages, as well as in scripting languages such as Javascript or PERL. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the internet using an Internet Service Provider). In some implementations, electronic circuitry including, for example, programmable logic circuitry, field-programmable gate arrays (FPGA), microcontroller units (MCUs), or programmable logic arrays (PLA) may execute the computer readable program instructions/code by utilizing state information of the computer readable program instructions to personalize the electronic circuitry, in order to perform aspects of the present disclosure.

The flowchart and block diagrams in the figures illustrate the architecture, functionality, and operation of possible implementations of apparatus (systems), methods and computer program products according to various implementations of the present disclosure. It will be understood that each block in the flowchart and/or block diagrams, and combinations of blocks in the flowchart and/or block diagrams, may represent a module, segment, or portion of code, which comprises one or more executable computer program instructions for implementing the specified logical function(s)/act(s). These computer program instructions may be provided to a processor of a general purpose computer, special purpose computer, or other programmable data processing apparatus to produce a machine, such that the computer program instructions, which may execute via the processor of the computer or other programmable data processing apparatus, create the ability to implement one or more of the functions/acts specified in the flowchart and/or block diagram block or blocks or combinations thereof. It should be noted that, in some alternative implementations, the functions noted in the block(s) may occur out of the order noted in the figures. For example, two blocks shown in succession may, in fact, be executed substantially concurrently, or the blocks may sometimes be executed in the reverse order, depending upon the functionality involved.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks or combinations thereof.

The computer program instructions may also be loaded onto a computer or other programmable data processing apparatus to cause a series of operational steps to be performed (not necessarily in a particular order) on the computer or other programmable apparatus to produce a computer implemented process such that the instructions which execute on the computer or other programmable apparatus provide steps for implementing the functions/acts (not necessarily in a particular order) specified in the flowchart and/or block diagram block or blocks or combinations thereof.

To perform distortion correction of a given resource, one may take care when measuring, isolating, and determining the magnitude and phase of each distortion product. This may be to adequately "pre-distort" the source tone accordingly, as to cancel out the respective distortion products. An example method, in conjunction with, e.g., the DCTM (LTX-Credence) design architecture, may be capable of industry performance levels of better than −140 dBc THD across the effective bandwidth (BW) of the dynamic source, 50 kHz. The process and method has been leveraged across other signal source resources as well, such as the HSB (LTX-Credence instrumentation), to provide equivalent performance improvements over a wider frequency range. Unfortunately, as is the case in the past, the need for a notch filter is generally required, since, e.g., the distortion products of the measurement system may ultimately corrupt the ability to determine the true content of the distortion product of the dynamic source itself.

This may burden the use to within the "Q" of the notch filter, its attenuation, and response across the bandwidth of interest. While still effective, the use of the notch filter and its design may limit the capability to that frequency only. As will be discussed in greater detail below, the present disclosure may enable the determination of the magnitude and phase of the distortion components of the dynamic source (e.g., AC source) without the need for a notch filter, which may provide the method as universal as well as provide ultra-pure tones with little or no need for filtering architectures (e.g., except for maybe reconstruction and or low pass network to improve SNR).

Figure 2:
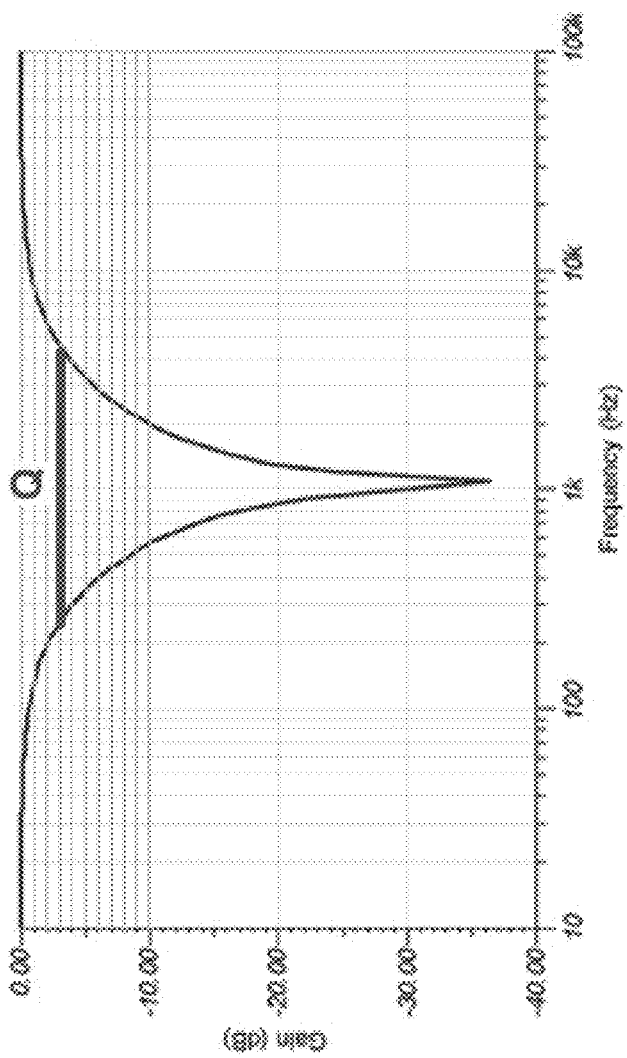
FIG. 2 is a diagrammatic view of an example notch filter response according to one or more implementations of the present disclosure.

Referring at least to FIG. 1, an example configuration 100 of an distortion/Harmonic test setup is shown. Configuration 100 may be used, e.g., to measure distortion products of a dynamic source. The measurement accuracy may be limited to the performance of the measurement resource capability, e.g., −90 dBc. However, by placing a notch filter to attenuate the fundamental of the dynamic source and subsequently gaining up the residuals, xG, the effective performance of the digitizer with respect to the amplitude of the dynamic source may now be $20*\log_{10}(xG)$ improved. That is, if the amount of attenuation, within the stop band of the notch-filter (attenuate the fundamental tone), were >40 dB and xG=100, the effective performance of the measurement instrument may improve by an additional 40 dB, from −90 dBc to −130 dBc. An example notch filter response, 1 kHz, 200 is shown at FIG. 2.

While this method may be effective, measurement capability and correlation of the true dynamic source performance may be a function of the signal conditioning network consisting of the notch filter and gain stage. Analysis of the performance of the system transfer function, such as phase and amplitude response, may be important for ultra high performance metrics, e.g., beyond 1 ppm. Measurement of the distortion performance referred to the input, dynamic source, may be a function of the response of the notch filter transfer function, as well as the response of the amplification stage over the bandwidth of interest. Careful attention may be made to the "Q" of the filter to understand not only the attenuation of the fundamental, but also the magnitude and phase response of each of the distortion products to be calibrated.

Figure 3:
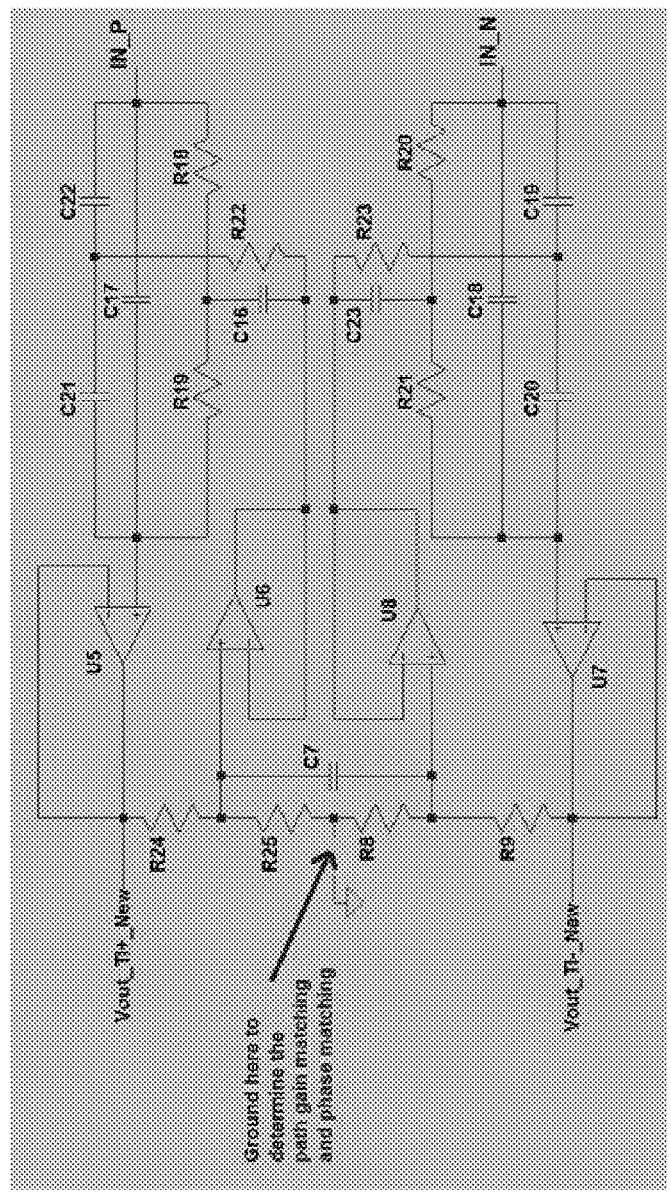
FIG. 3 is a diagrammatic view of an example design of a Twin T Notch Filter with Gyrator according to one or more implementations of the present disclosure.
Figure 4:
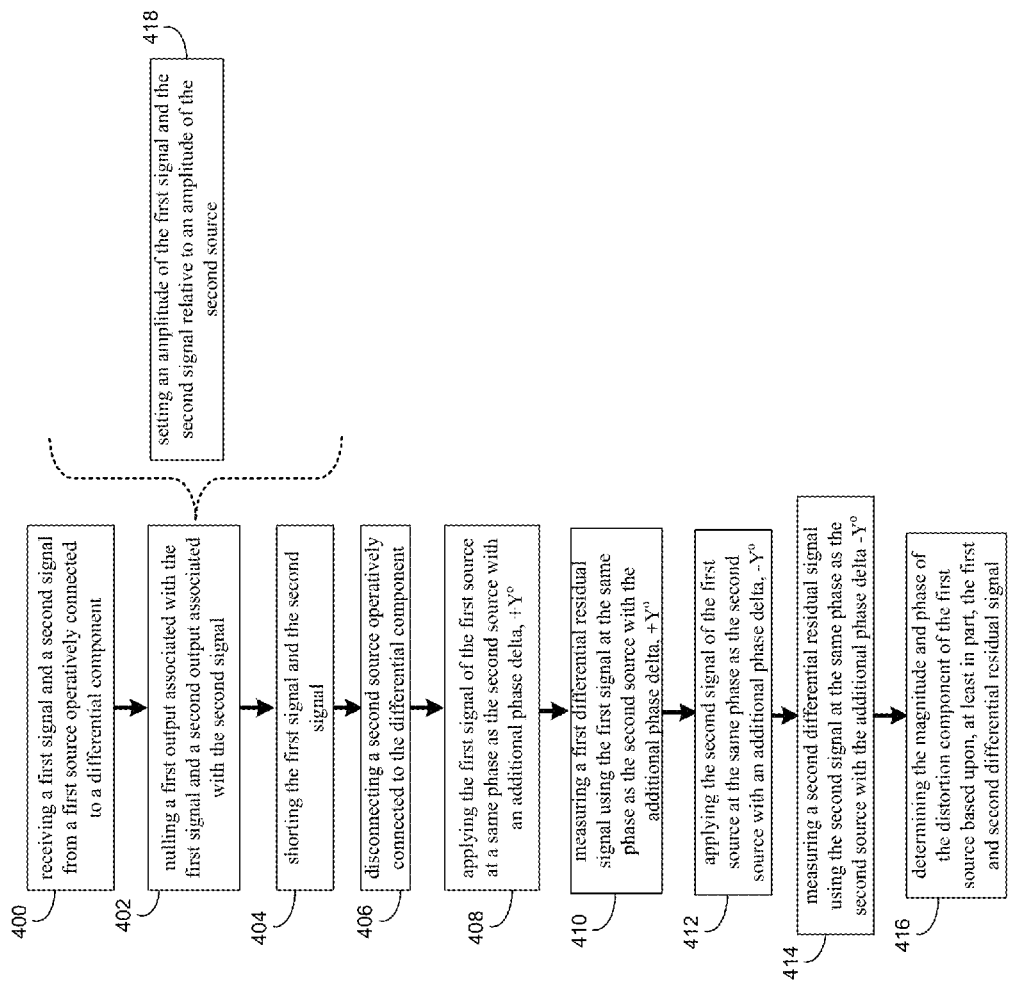
FIG. 4 is an illustrative flowchart of a correction process according to one or more implementations of the present disclosure.
Figure 5:
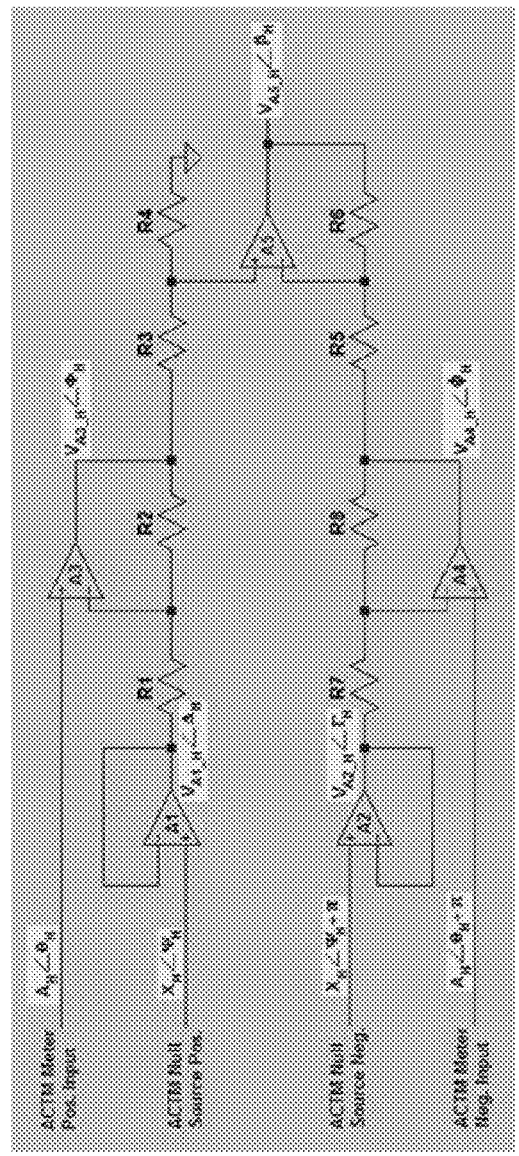
FIG. 5 is a diagrammatic view of an example front end design according to one or more implementations of the present disclosure.

Design features and material physics may have played a significant role to minimize those errors. An example design 300 of a Twin T Notch Filter with Gyrator is shown at FIG. 3, which may be used to obtain performance beyond 0.1 ppm. Component selection and layout may be critical to meeting these performance metrics.

Care may be taken into consideration regarding the calculation of the magnitude and phase of the distortion products since, e.g., this may be a function of the frequency response, transfer function, of the notch filter itself. This may be commonly caused by the "Q" of the filter which may define the filters bandwidth; however, the magnitude and phase of the filter may need to be well understood across the entire analog bandwidth of the signal source. This is a step commonly lost when dealing with performance criteria beyond 1 ppm. The ratio of R24 & R25, as well as R8 & R9 should be matched, and these ratios may also control the "Q" of design 300.

While the above may have been used successfully, an example limitation is that it provides the means of determining the calibration metrics for a single frequency defined by the filters design. The design of which must meet the requirements of configuration (e.g., differential, pseudo, or single ended), amplitude, as well as frequency. This may burden the use to within the "Q" of the notch filter, its attenuation, and response across the bandwidth of interest. While still effective, the use of the notch filter and its design may limit the capability to that frequency. As will be discussed in greater detail below, the present disclosure may enable the determination of the magnitude and phase of the distortion components of the dynamic source (e.g., AC source) without the need for a notch filter, which may provide the method as universal as well as provide ultra-pure tones with little or no need for filtering architectures (e.g., except for maybe reconstruction and or low pass network to improve SNR), and may remove the signal conditioning stage. A distortion component may be any type of distortion/error found in a tone (e.g., source tone). An example of a distortion component may include spurious-free dynamic range (SFDR).

As discussed above and referring also at least to FIGS. 4-21, at least for determining a magnitude and phase of a distortion component, performed by one or more computing devices, correction process 10 may receive 400, by a computing device, a first signal and a second signal from a first source operatively connected to a differential component. A first output associated with the first signal and a second output associated with the second signal may be nulled 402 by correction process 10. The first signal and the second signal may be shorted 404 by correction process 10. A second source operatively connected to the differential component may be disconnected 406 by correction process 10. The first signal of the first source may be applied 408 by correction process 10 at a same phase as the second source with an additional phase delta, +Y°. A first differential residual signal may be measured 410 by correction process 10 using the first signal at the same phase as the second source with the additional phase delta, +Y°. The second signal of the first source may be applied 412 by correction process 10 at the same phase as the second source with an additional phase delta, −Y°. A second differential residual signal may be measured 414 by correction process 10 using the second signal at the same phase as the second source with the additional phase delta, −Y°. The magnitude and phase of the distortion component of the first source may be determined 416 by correction process 10 based upon, at least in part, the first and second differential residual signal.

Some assumptions may be made and explained throughout to help broadly describe possible implementations. However, these assumptions should be taken as example only and not to limit the scope of the present disclosure. In some implementations, the present disclosure may be performed with the Multi-Wave Source/Digitizer developed by LTX-Credence, MatLab simulation, and a physical model simulation, TINA. The Multi-Wave instrument may include a composite mixed signal instrument. It will be appreciated that correction process 10 may be leveraged on any mixed signal resource.

In some implementations, correction process 10 may receive 400, by a computing device, a first signal and a second signal from a first source operatively connected to a differential component. For example, and referring at least to FIG. 5, an example front end design 500 to the above-noted Multi-Wave Digitizer is shown. In some implementations, at least one of the first source and the second source may be at least one of an input source (e.g., input source, $A_H$) and a nulling source (e.g., nulling source, $X_H$). Other example sources may be used without departing from the scope of the disclosure. The example differential component (e.g., differential component A5) is shown as an operational amplifier, however, it will be appreciated that any object capable of performing similar functions may be used without departing from the scope of the disclosure. It will be appreciated that while the description includes implementations involving correction process 10 separately performing operations 400-418 twice (e.g., once on the input source and once on the nulling source), this should be taken as an example only and not to limit the scope of the disclosure. For example, even where two sources are used, correction process 10 may perform some or all operations 400-418 on only the nulling source, only the input source, or a combination thereof without departing from the scope of the disclosure. In some implementations, at least one of the first source and the second source may be at least one of a true differential, a pseudo differential, and a single ended configuration. That is, in the example, the magnitude and phase of the distortion products for both the input source, $A_H$, and the Nulling Source, $X_H$, may be true differential (i.e., magnitude and phase of each coherent bin of the FFT is equal and 180° out of phase with its respective complimentary signal). Pseudo differential signaling may be described as a signal whereby its complimentary pin may be set at a static DC reference or common mode level, and a single ended signal is as stated whereby there may be no complimentary signal.

Continuing with the above example, the output of stage A1 and A2 may result in the magnitude and phase response of each follower, as well as the signal excitation source, $X_H \angle \Psi_H$, Equation 1, and $X_H \angle \Psi_H + \pi$, Equation 2, respectively.

$$V_{A1\_H} \angle \Delta_H = G_{A1}\left[\frac{X_H}{2} \angle \Psi_H\right] + A1\_H \angle \phi_{A1\_H} \quad \text{Equation 1}$$

$$V_{A2\_H} \angle \Gamma_H = G_{A2}\left[\frac{X_H}{2} \angle (\Psi_H + \pi)\right] + A2\_H \angle \phi_{A2\_H} \quad \text{Equation 2}$$

Given:
A1_H∠$\phi_{A1\_H}$ and A2_H∠$\phi_{A2\_H}$:Amp distortion performance magnitude and phase
$G_{A1}$ & $G_{A2}$: Amp Gain (Buffer Stage≈1)

Evaluating Equation 1 and Equation 2 through the differential gain stage of A3 & A4 as well as the signal excitation source, $A_H \angle \theta_H$ & $A_H \angle \theta_H + \pi$, may result in Equation 3 and Equation 4, respectively.

$$V_{A3\_H} \angle \Phi_H = \quad \text{Equation 3}$$
$$\frac{A_H}{2} \angle \theta_H + \frac{R_2}{R_1}\left[\frac{A_H}{2} \angle \theta_H - V_{A1\_H} \angle \Delta_H\right] + \frac{R_2}{R_1}[A3\_H \angle \phi_{A3\_H}]$$

$$V_{A4\_H} \angle \phi_H = \frac{A_H}{2} \angle (\theta_H + \pi) + \quad \text{Equation 4}$$
$$\frac{R_8}{R_7}\left[\frac{A_H}{2} \angle (\theta_H + \pi) - V_{A2\_H} \angle \Gamma_H\right] + \frac{R_8}{R_7}[A4\_H \angle \phi_{A4\_H}]$$

Given:
A3_H∠$\phi_{A3\_H}$ & A4_H∠$\phi_{A4\_H}$: Amp distortion performance Magnitude & Phase In some implementations, the gain matching error and temperature coefficient, TC, tracking of R3=R5 & R4=R6 may be 1/1000th of the magnitude error of the distortion product given a resistance tolerance, Rtol=0.1%. Since the distortion product should be on the order of <<80 dBc, then the source of error for this assumption should be on the order of 80 dBc+20 log10(1000)=140 dBc.

Combining Equation 3 and Equation 4 through the differential gain stage of A5 may yield Equation 5.

$$V_{A5\_H} \angle \beta_H = \frac{R_4}{R_3}[V_{A3\_H} \angle \Phi_H - V_{A4\_H} \angle \phi_H] \quad \text{Equation 5}$$

Substituting and solving Equation 1 into Equation 3 and Equation 2 into Equation 4 may provide the solution for Equation 6 and Equation 7, respectively.

$$V_{A3\_H} \angle \Phi_H = \left(1 + \frac{R_2}{R_1}\right)\left[\frac{A_H}{2} \angle \theta_H\right] - \quad \text{Equation 6}$$
$$\frac{R_2}{R_1}\left(G_{A1}\left[\frac{X_H}{2} \angle \Psi_H\right]\right) + \frac{R_2}{R_1}(A3\_H \angle \phi_{A3\_H} - A1\_H \angle \phi_{A1\_H})$$

$$V_{A4\_H} \angle \Phi_H = \quad \text{Equation 7}$$
$$\left(1 + \frac{R_8}{R_7}\right)\left[\frac{A_H}{2} \angle (\theta_H + \pi)\right] - \frac{R_8}{R_7}\left(G_{A2}\left[\frac{X_H}{2} \angle (\Psi_H + \pi)\right]\right) +$$
$$\frac{R_8}{R_7}(A4\_H \angle \phi_{A4\_H} - A2\_H \angle \phi_{A2\_H})$$

In some implementations, a first output associated with the first signal and a second output associated with the second signal may be nulled 402 by correction process 10. In some implementations, nulling 402 the first output and the second output may include setting 418 an amplitude of the first signal and the second signal relative to an amplitude of the second source. For example, to first order and tracking, R8=R2 & R7=R1. Given the architecture of the front end differential stage, as well as GA1=GA2≈1, correction process 10 may set the amplitude of the nulling source, $X_H$, to the amplitude of the Input Source, $A_H$, multiplied by (R1+R2)/R2 for the signal at the output of A3 and A4 to be truly "Nulled". In some implementations, a Relative Switching Differential Method (RSDM) technique may assume that the magnitude and phase of the distortion products of the individual amplifiers themselves, A1_H∠$\phi_{A1\_H}$, A2_H∠$\phi_{A2\_H}$, A3_H∠$\phi_{A3\_H}$, and A4_H∠$\phi_{A4\_H}$ are constant over the changing conditions of the phase of the fundamental for both the input source and null source, as will be discussed in greater detail below. Assuming this not to be true, to independently determine the input source harmonics and the nulling source harmonics, multiple iterations may be executed at the different amplitudes according to its respective amplitude.

Using direct substitution to simplify the discussion, all of the distortion products associated with A1, A2, A3, and A4 may be combined:

$$x \angle \sigma_H = \frac{R_4}{R_3}\frac{R_2}{R_1}(A3\_H \angle \phi_{A3\_H} - A1\_H \angle \phi_{A1\_H}) - \quad \text{Equation 8}$$
$$\frac{R_6}{R_5}\frac{R_8}{R_7}(A4\_H \angle \phi_{A4\_H} - A2\_H \angle \phi_{A2\_H})$$

Substituting and solving Equation 5: Given R8=R2 and R7=R1 and GA1=GA2≈1

$$V_{A5\_H} \angle \beta_H = \frac{R_4}{R_3}\left(1 + \frac{R_2}{R_1}\right)A_H \angle \theta_H - \frac{R_4}{R_3}\left(\frac{R_2}{R_1}\right)X_H \angle \Psi_H + X \angle \sigma_H \quad \text{Equation 9}$$

Equation 9 represents the final expression that contains two unknown quantities, $A_H \angle \theta_H$ & $X_H \angle \Psi_H$, and another unknown quantity, $X \angle \sigma_H$.

Solving an equation with two unknowns may require two unique equations that may also describe the correlation between the two variables and its respective output. In some implementations, another equation may be developed such that, $X \angle \sigma_H$, remains constant. In some implementations, the magnitude of the distortion component may remain constant while the phase of the distortion component may move according to its position with respect to the second signal. For example, correction process 10 may change the phase of the fundamental only. That is, by adjusting the phase of the fundamental by +/−Y° the magnitude of the distortion products may remain constant while the phase of the distortion products may move according to its position with respect to the fundamental, i.e., (Nbin/Mbin*Y°). In the example, each coherent bin of the frequency transform of the time domain capture of the output, $V_{A5\_H} \angle \beta_H$, may contain a phasor consisting of magnitude and direction (phase) of the vector sum of the input source, nulling source, and its associated path.

In some implementations, the first signal and the second signal may be shorted 404 by correction process 10. For example, shorting 404 the two inputs together and source the nulling tone into both sides may provide a solution for the distortion products of the nulling source. While the two inputs are shorted, correction process 10 may apply the input source to both inputs, where, using the above calculations, correction process 10 may solve for its respective distortion products.

Figure 6:
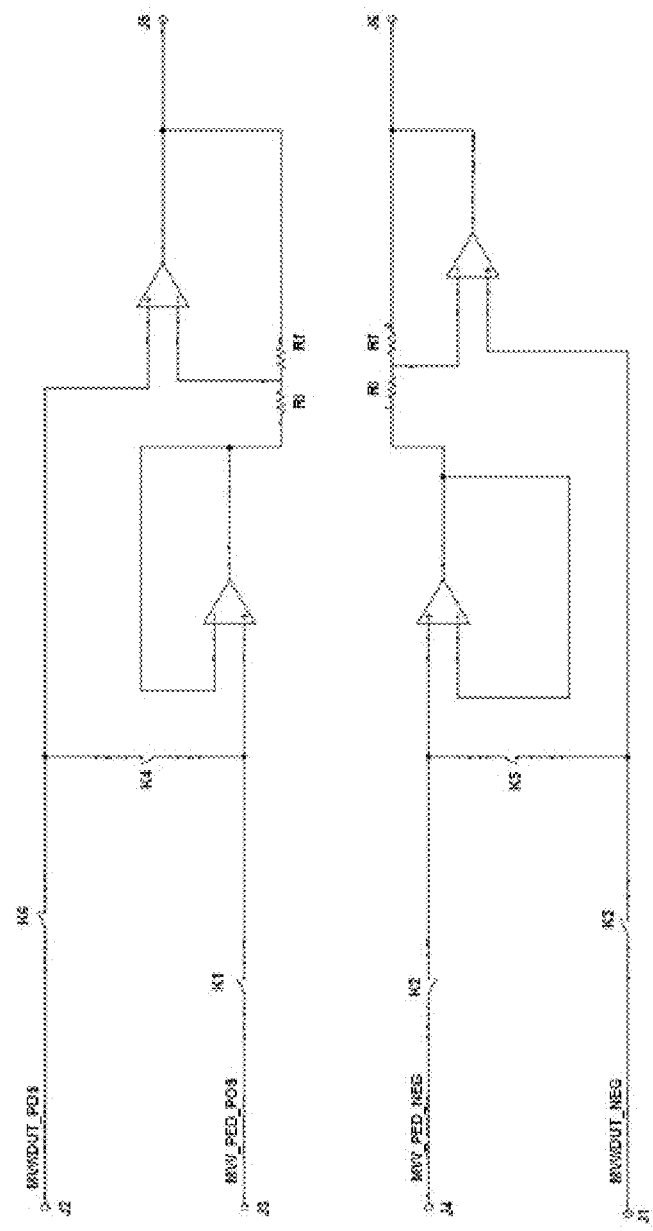
FIG. 6 is a diagrammatic view of an example digitizer front end design according to one or more implementations of the present disclosure.
Figure 7:
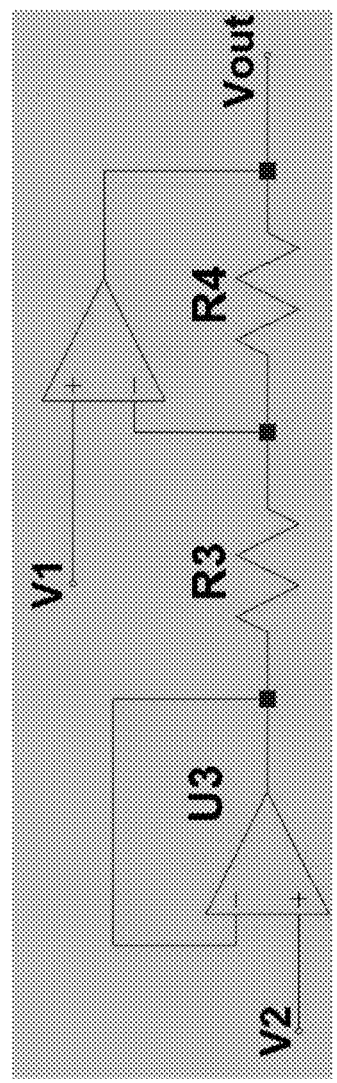
FIG. 7 is a diagrammatic view of an example differential stage design according to one or more implementations of the present disclosure.

For example, and referring at least to FIG. 6, an example digitizer front end design 600 is shown. In the example, the first signal and the second signal may be shorted 404 by closing one or more relays. For instance, correction process 10 may close switches K4 and K5. In some implementations, a second source operatively connected to the differential component may be disconnected 406 by correction process 10. In the example, the second source may be disconnected 406 by opening one or more relays. For instance, correction process 10 may disconnect 406 one of the input sources, in this example the input Source, $A_H$ (MW/DUT_POS and MW/DUT_NEG) by opening switches K3 and K6.

In some implementations, the first signal of the first source may be applied 408 by correction process 10 at a same phase as the second source with an additional phase delta, $+Y°$. For example, correction process 10 may apply 408 the null source (MW_PED_POS and MW_PED_NEG), $X_H=A_H*(R1+R2)/R2$ at the same phase as the fundamental$+5°$ by closing switches K1 and K2.

In some implementations, a first differential residual signal may be measured 410 by correction process 10 using the first signal at the same phase as the second source with the additional phase delta, $+Y°$. For example, correction process 10 may measure the differential residual signal (at J5 and J6), $V_{M1\_H} \angle \xi M1\_H$. In some implementations, the second signal of the first source may be applied 412 by correction process 10 at the same phase as the second source with an additional phase delta, $-Y°$. For example, correction process 10 may apply the null source (MW_PED_POS and MW_PED_NEG), $X_H=A_H*(R1+R2)/R2$ at the same phase as the fundamental $-5°$ by closing switches K1 and K2. In some implementations, a second differential residual signal may be measured 414 by correction process 10 using the second signal at the same phase as the second source with the additional phase delta, $-Y°$. For example, correction process 10 may measure 414 the residual signal (at J5 and J6), $VM2\_H \angle \xi M2\_H$ In some implementations, the magnitude and phase of the distortion component of the first source may be determined 416 by correction process 10 based upon, at least in part, the first and second differential residual signal. For example, correction process 10 may now solve two equations and two unknowns for the final answer:

$$\Delta_H = \text{Phase\_Delta}\left(\frac{N_{bin}}{M_{bin}}\right); \text{Phase\_Delta} = 5° \quad \text{Equation 10}$$

Where Nbin=Bin location of the distortion product, Mbin is the fundamental bin location.

$$V_{M1\_H} \angle \xi_{M1\_H} = \frac{R_4}{R_3}\left(1 + \frac{R_2}{R_1}\right) X_H \angle (\Psi_H + \Delta_H) - \quad \text{Equation 11}$$
$$\frac{R_4}{R_3}\left(\frac{R_2}{R_1}\right) X_H \angle (\Psi_H + \Delta_H) + X \angle \sigma_H$$

$$V_{M2\_H} \angle \xi_{M2\_H} = \frac{R_4}{R_3}\left(1 + \frac{R_2}{R_1}\right) X_H \angle (\Psi_H + \Delta_H) - \quad \text{Equation 12}$$
$$\frac{R_4}{R_3}\left(\frac{R_2}{R_1}\right) X_H \angle (\Psi_H - \Delta_H) + X \angle \sigma_H$$

Correction process 10 may then subtract the two equations, the contribution of Equation 8 will drop out and may result in the following, Equation 13:

$$\Delta V_{M12} \angle \theta_{M12} =$$
$$V_{M1\_H} \angle \xi_{M1\_H} - V_{M2\_H} \angle \xi_{M2\_H} = \frac{R_4}{R_3}[X_H \angle (\Psi_H + \Delta_H) - X_H \angle (\Psi_H - \Delta_H)]$$

In some implementations, the above may be converted to Cartesian coordinates to isolate each phasor component magnitude and direction (phase).

$$\cos(\theta_{M12}) + i\sin(\theta_{M12}) = \cos(\Psi_H + \Delta_H) + \quad \text{Equation 13}$$
$$i\sin(\Psi_H + \Delta_H) - \cos(\Psi_H - \Delta_H) - i\sin(\Psi_H - \Delta_H)$$

$$\sin(\alpha - \beta) = \sin(\alpha)\cos(\beta) - \cos(\alpha)\sin(\beta) \quad \text{Equation 14}$$
$$\cos(\alpha - \beta) = \cos(\alpha)\cos(\beta) + \sin(\alpha)\sin(\beta)$$
$$\sin(\alpha + \beta) = \sin(\alpha)\cos(\beta) + \cos(\alpha)\sin(\beta)$$
$$\cos(\alpha + \beta) = \cos(\alpha)\cos(\beta) - \sin(\alpha)\sin(\beta)$$

$$-2\sin(\Psi_H)\sin(\Delta_H) + 2i\cos(\Psi_H)\sin(\Delta_H) = \quad \text{Equation 15}$$
$$\cos(\theta_{M12}) + i\sin(\theta_{M12})$$

$$\tan(\theta_{M12}) = \frac{\sin(\theta_{M12})}{\cos(\theta_{M12})} = -\frac{\cos(\Psi_H)}{\sin(\Psi_H)} = -\cot(\Psi_H) \quad \text{Equation 16}$$

$$-\cos(\Psi_H)\cos(\theta_{M12}) + \sin(\Psi_H)\sin(\theta_{M12}) = 0 \quad \text{Equation 17}$$
$$-\cos(\Psi_H + \theta_{M12}) = 0$$
$$\Psi_H = 90 - \theta_{M12}$$

Equation 17 may provide the direction, phase, of the respective distortion bin, and Equation 18 may provide the solution for the relative magnitude of the distortion product:

$$\Delta V_{M12} = \frac{R_4}{R_3} X_H[-2\sin(\Psi_H)\sin(\Delta_H) + 2i\cos(\Psi_H)\sin(\Delta_H)] \quad \text{Equation 18}$$

$$X_H = \frac{(\Delta V_{M12}/2\sqrt{2})}{\sin(\Psi_H)\sin(\Delta_H)} \frac{R_3}{R_4}$$

In some implementations, the magnitude and phase of the distortion component may be determined 416 without a notch filter. For instance, it will be appreciated that use of the architecture described throughout is not exclusive to correction process 10 and should not be taken to limit the scope of the disclosure. The architecture has been chosen for simplicity purposes as the output of this stage at J5 and J6 may return a "virtual" copy of the input signal. For example, and referring at least to FIG. 7, an example differential stage design 700 is shown with Vout=V1(1+R4/R3)−V2(R4/R3). In the example, a "virtual" copy may broadly be described as mean that its magnitude is altered by the signal path, however, its relative direction to that of the input signal as well as its own distortion component, which is a function of amplitude, changes accordingly. Thus, this example architecture was chosen as the driving input to the analyzer stage. In the example, by placing a signal at V2 which is in phase with that of V1 and has a magnitude that is V1(1+R3/R4), an effective notch or attenuation of the fundamental of the signal may be measured at the output, Vout. It is this application that, at least in part, effectively implements the function of the notch-filter as well as the gain stage, thereby removing the limiting factors of the notch-filter design itself.

An example mathematical model of one or more portions of the above present disclosure and computed results is discussed below. In the example, the mathematical software package, MatLab, was used.

Figure 8:
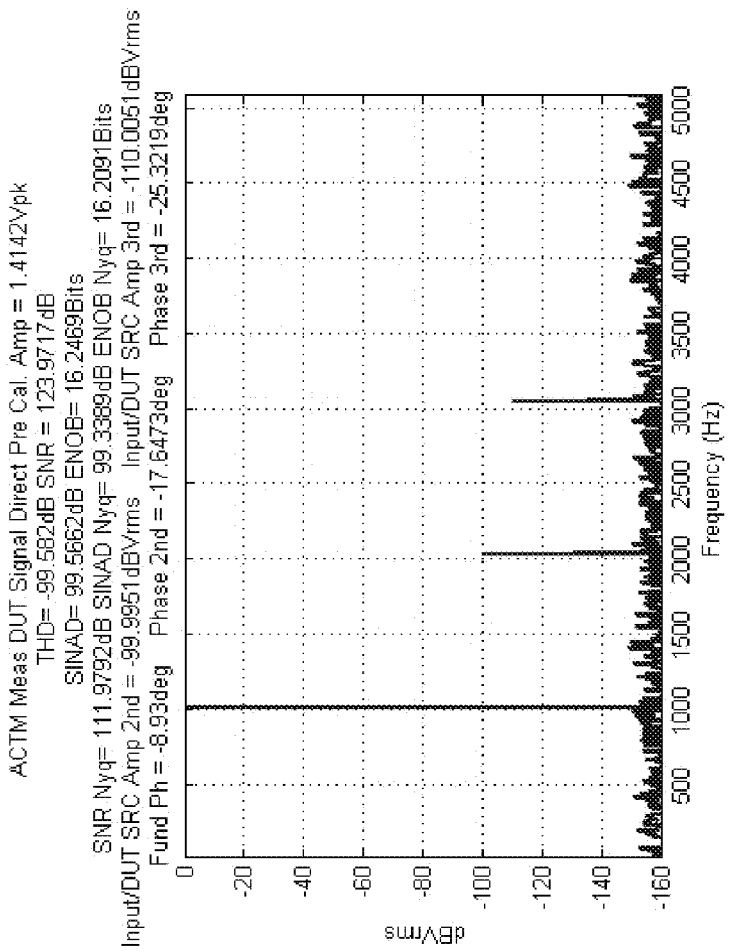
FIG. 8 is an illustrative diagrammatic view of a screen image displayed by the correction process according to one or more implementations of the present disclosure.

Referring at least to FIG. 8, an distortion correction simulation 800 of source distortion $A_H$ (MW/DUT_POS & MW/DUT_NEG) is shown. FIG. 8 shows an example input source (DUT) signal performance as simulated. The distortion, noise, and phase information may be programmed by correction process 10 as a means for simulation.

Figure 9:
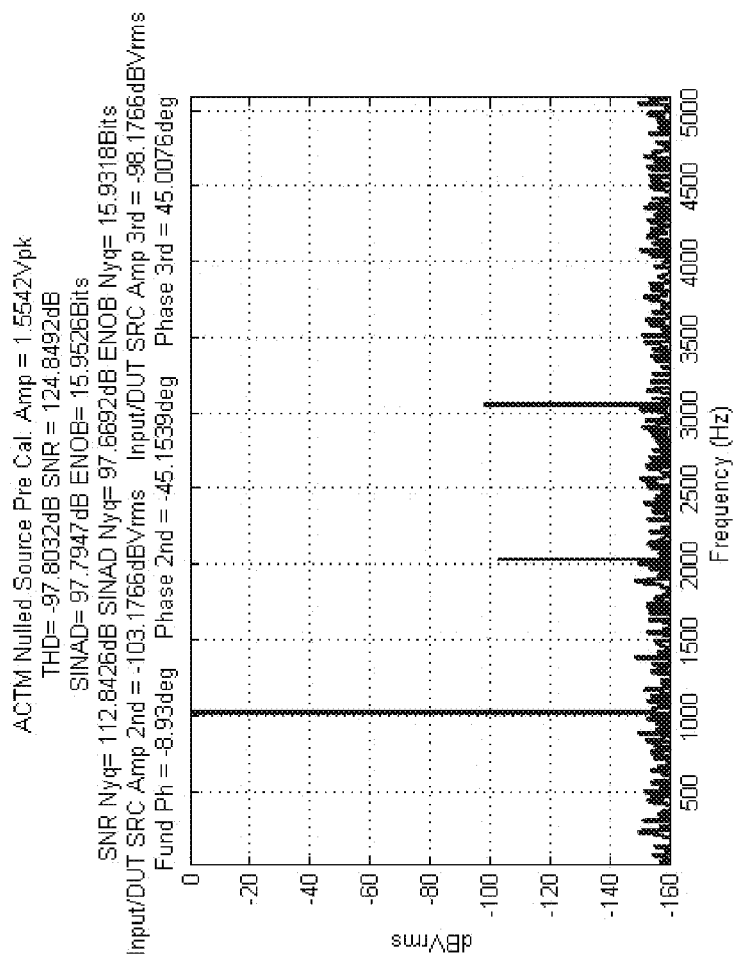
FIG. 9 is an illustrative diagrammatic view of a screen image displayed by the correction process according to one or more implementations of the present disclosure.

Referring at least to FIG. 9, a simulated source distortion 900, $X_H$ (MW_PED_POS & MW_PED_NEG) is shown. FIG. 9 shows an example "nulling" source signal performance as simulated. The distortion, noise, and phase information may be programmed by correction process 10 as a means for simulation. Note that the phase and magnitude of the harmonic products is slightly changed and note the phase and magnitude of the fundamental with respect to the input source (DUT).

Figure 10:
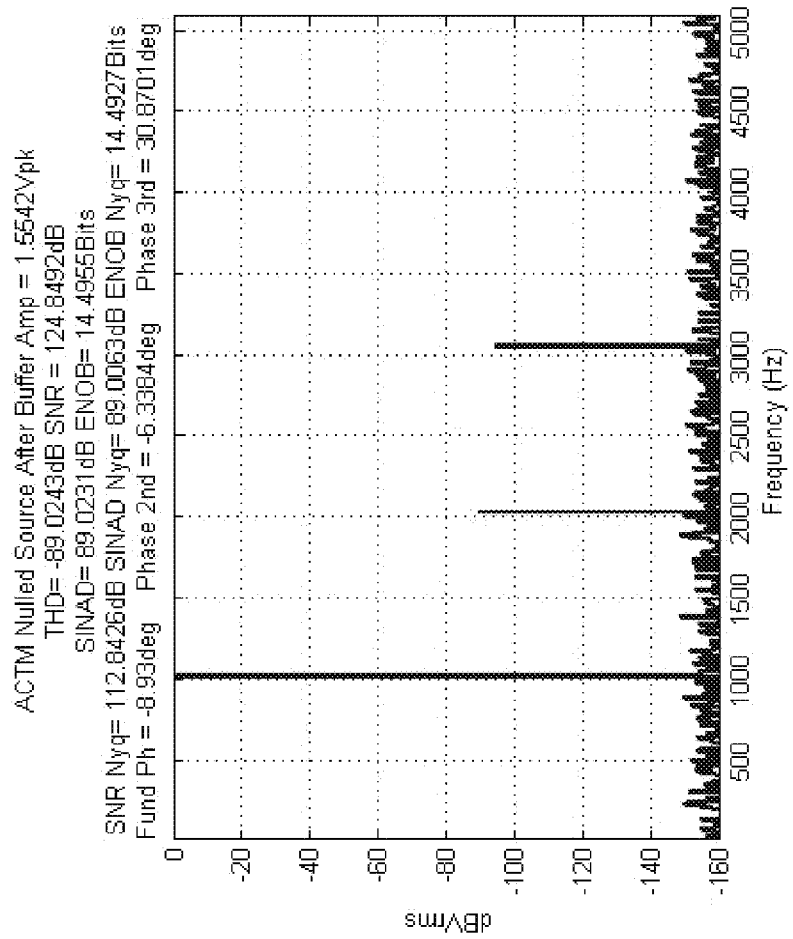
FIG. 10 is an illustrative diagrammatic view of a screen image displayed by the correction process according to one or more implementations of the present disclosure.

Referring at least to FIG. 10, an example simulated buffer distortion 1000 is shown. In some implementations, the front end of the proposed Load Board Assist may be the same as the pedestal front end of the ACTM Digitizer shown in FIG. 5. As such, the amplifiers, or buffers, may have some unknown distortion components associated with each independent path. The simulation shows the potential differential distortion associated with its performance. The results shown in FIG. 10 show the relative change in the resulting magnitude and direction of the distortion components of the nulling source through the follower stage of A1 and A2. It is this performance that correction process 10 is attempting to isolate with the combination of the architecture as well as algorithmic procedure.

Figure 11:
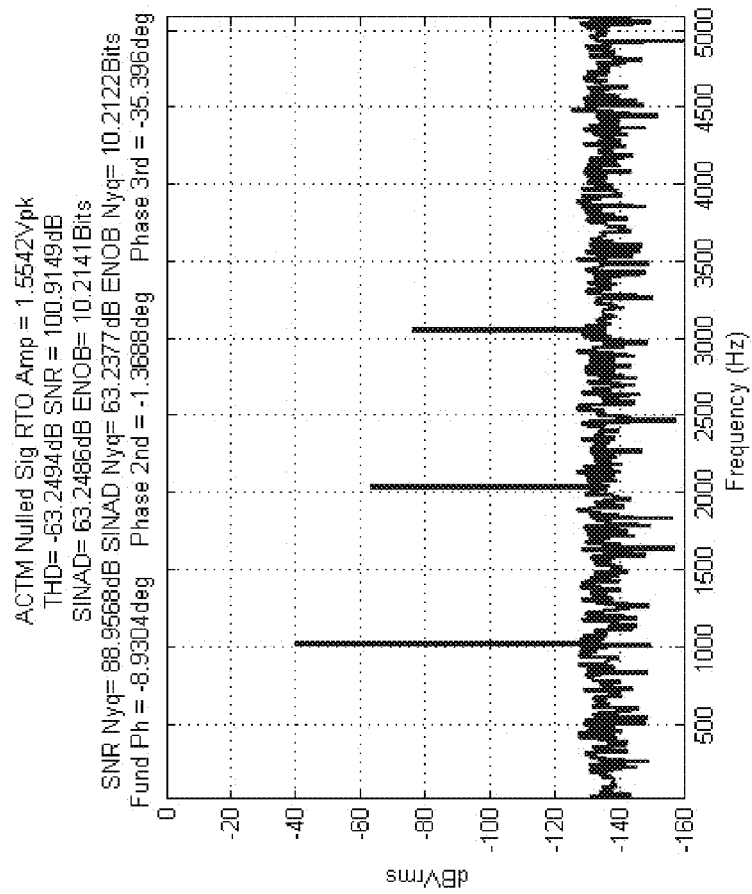
FIG. 11 is an illustrative diagrammatic view of a screen image displayed by the correction process according to one or more implementations of the present disclosure.

Referring at least to FIG. 11, example residual distortion product(s) measurements 1100 is shown. More particularly, FIG. 11 shows the result of the measured value of the output after the input source (DUT) and nulling source have been applied to the simulated signal path. Note the attenuation of the fundamental, 40 dB, and the residual distortion products magnitude and phase. Also note the increase in the SNR. This may be a function of the gain stage that was added after the attenuation of the fundamental, R2/R1. Accordingly, in the example, the SNR at the output may shift by, 20*log(1+R2/R1) +3 dB or 23.8 dB. Further in the example, the front end of the ACTM digitizer has a gain of 10 with respect to Pedestal and 11× wrt the input source. Again, this stage also contributes distortion products accordingly, which are simulated here.

FIGS. 8-11 have been used as an example demonstration to show the composite issue of how the signal path may affect the resultant measured information regarding the distortion components. The concern is isolating those factors and developing a solution to isolate those terms in order to remove them from measured signal to accurately determine the true performance of the signal source as well as the "nulling" source. Using this input stage as the model, the discussion below may focus on the magnitude and direction of the distortion components as they progress to the output stage using the above process associated with correction process 10.

Without changing the simulated parameters for the path or the signal sources, input source (design under test or DUT) and "nulling" source, correction process 10 may short the inputs of the input stage and remove the input source (DUT). Because the output may provide a "virtual" copy of the input signal, note the SNR, and distortion and phase parameters of the resulting measured signal. While the SNR has not changed (as may be expected), nor the phase or amplitude of the "nulling" source, the distortion components magnitude and phase have been altered from what has been simulated. Again, this can be seen because of the vector sum of these products as a function of frequency, magnitude, and phase.

Figure 12:
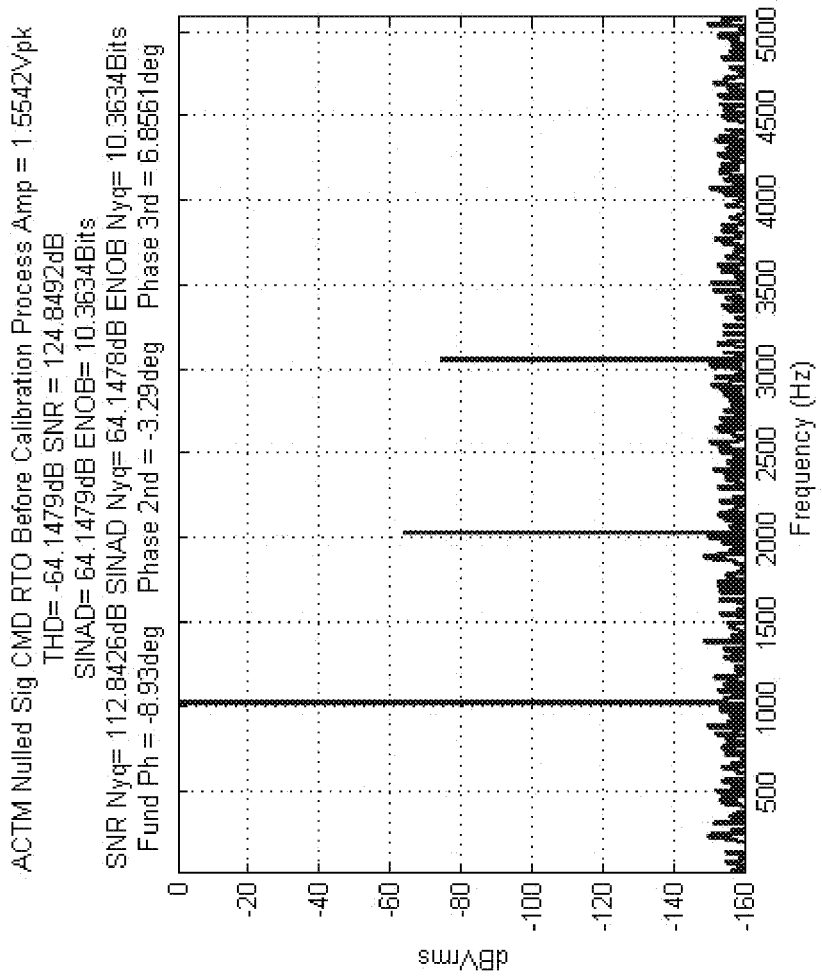
FIG. 12 is an illustrative diagrammatic view of a screen image displayed by the correction process according to one or more implementations of the present disclosure.
Figure 13:
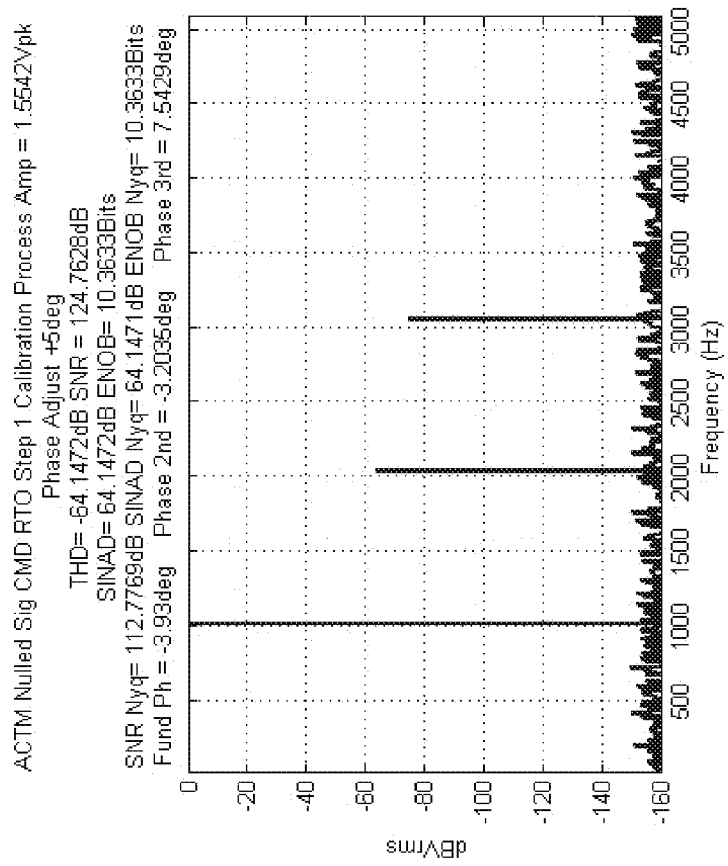
FIG. 13 is an illustrative diagrammatic view of a screen image displayed by the correction process according to one or more implementations of the present disclosure.
Figure 14:
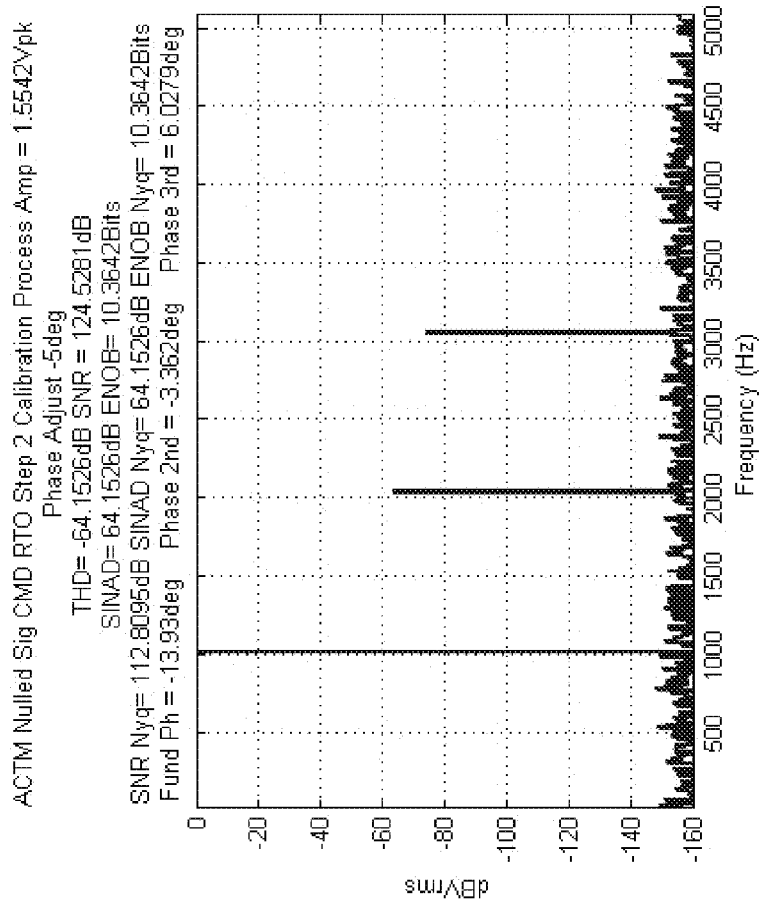
FIG. 14 is an illustrative diagrammatic view of a screen image displayed by the correction process according to one or more implementations of the present disclosure.
Figure 15:
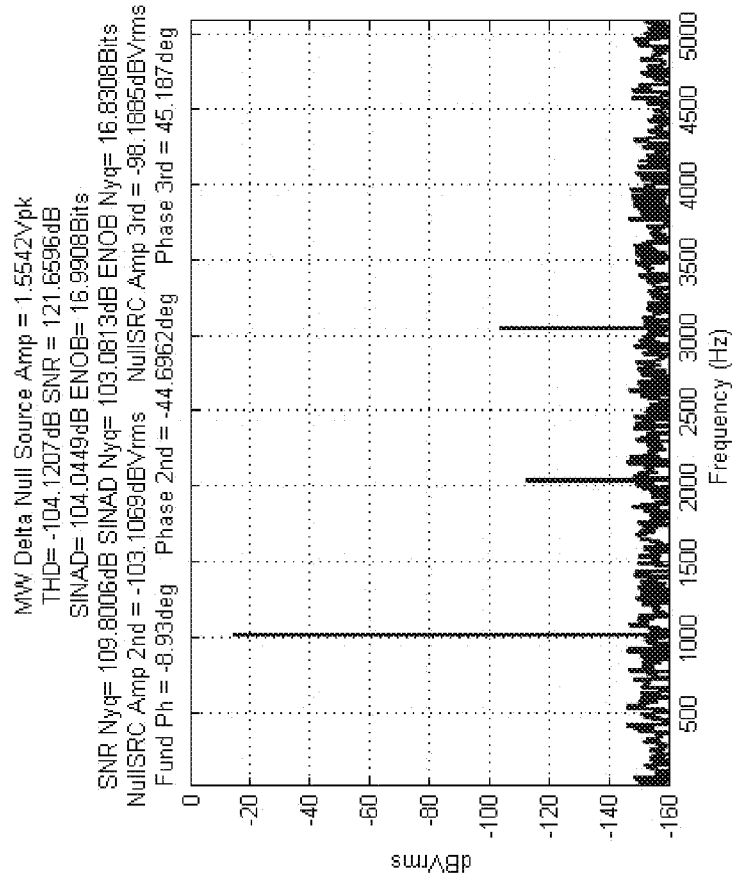
FIG. 15 is an illustrative diagrammatic view of a screen image displayed by the correction process according to one or more implementations of the present disclosure.

Referring at least to FIG. 12, an example simulation 1200 of the return of input signal and distortion products of A3 and A4 is shown. In the example, to isolate the necessary parameters to accurately determine the true distortion performance metrics of the "nulling" source, correction process 10 may make an adjustment to the phase of the source, such that correction process 10 may make a relative differential determination as to the actual performance of the "nulling" source itself. Correction process 10 may also perform the same procedure for the input source to determine its performance as well. In some implementations, the amount of shift in the phase angle may be a function of the signal frequency and resolution to which phase may be moved. For example, simulation 1300 in FIG. 13 and simulation 1400 in FIG. 14 show the results of the output with a +/−5 degree shift in the phase of the fundamental, respectively. Applying the above model associated with this process allows correction process 10 to then determine 416 the distortion products magnitude and phase of the resource itself. FIG. 15 shows the results 1500 as calculated, noting the calculated magnitude and phase with respect to what is simulated.

The application of the final results may be a function of the requirements of the vendor. Because correction process 10 may be able to accurately determine the true magnitude and direction of the source and path, the above-noted process may be used to subtract from the measured information to attain the performance of the source itself. In some implementations, this may be done, e.g., digitally and/or with the use of digital signal processing techniques with the use of a processing unit, each of which may execute correction process 10 in whole or in part.

Figure 16:
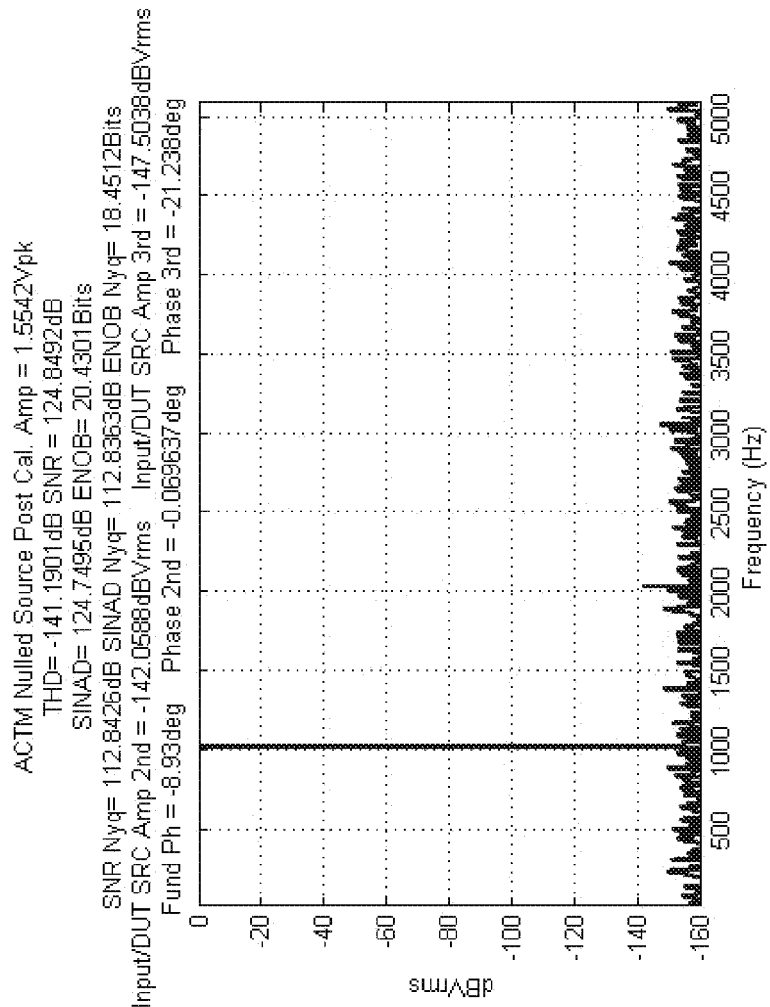
FIG. 16 is an illustrative diagrammatic view of a screen image displayed by the correction process according to one or more implementations of the present disclosure.
Figure 17:
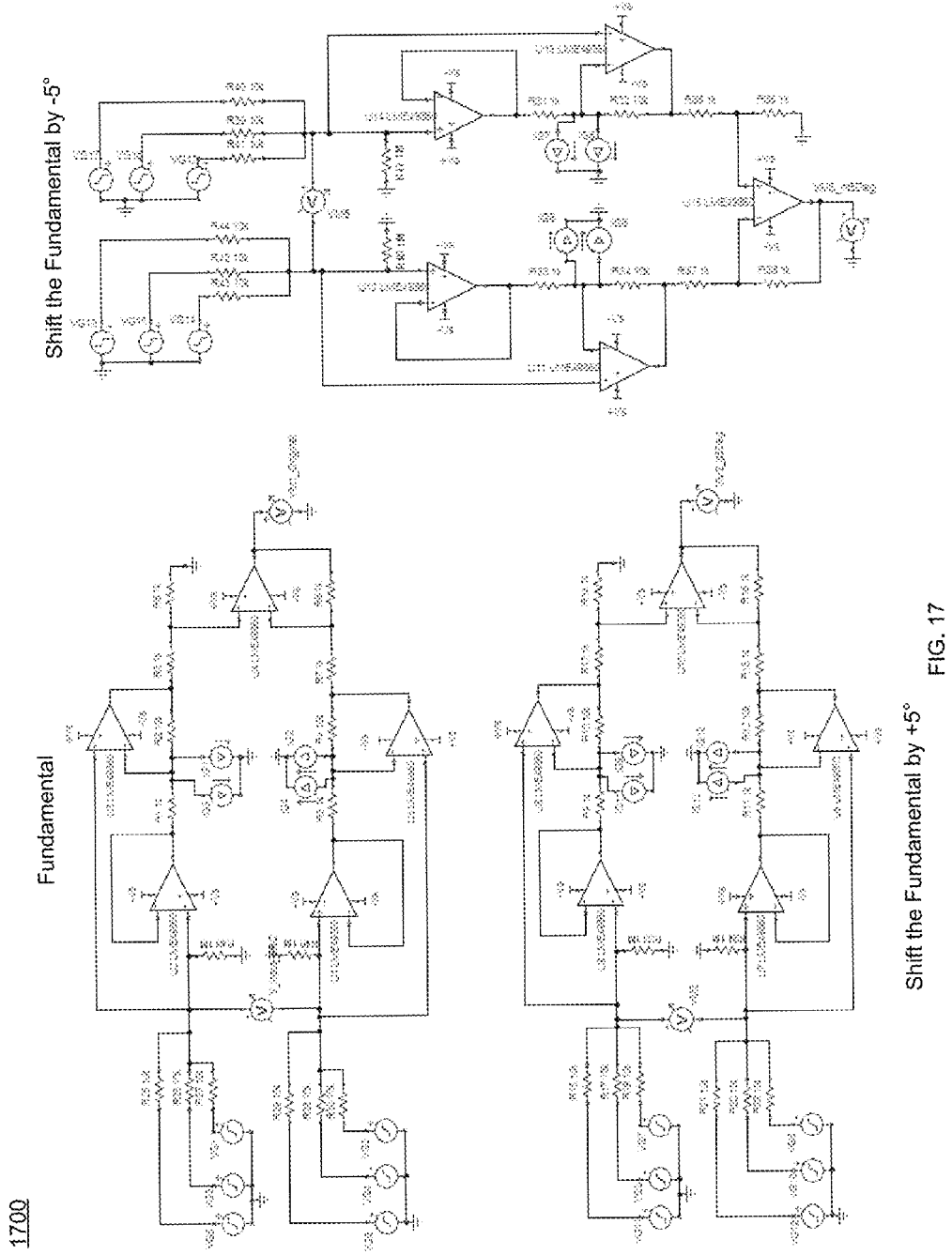
FIG. 17 is a diagrammatic view of an example circuit simulator according to one or more implementations of the present disclosure.

In some implementations, correction process 10 may "predistort" the source accordingly as to provide a true high fidelity signal. Referring at least to FIG. 16, the final magnitude and phase correction result simulation 1600 calculated from the results of FIG. 13 subtracted by the results of FIG. 14 is shown. For final verification, the distortion products, magnitude and phase of simulation 1500 should be essentially equivalent to FIG. 9 described above. Here, the RSDM algorithm calculates the distortion products of the nulling source independent of the path. This is notable as the need for a notch filter to improve the effective performance of the digitizer may be removed. It is here where a universal method is the ultimate goal without the need for additional circuitry, notch filter, etc. may be used with the present disclosure. As such, correction process 10 may be able to determine the phase and magnitude of each coherent bin of the input source and nulling source independently without the need for notch filter(s). Using the measured values of FIG. 13 and FIG. 14, correction process 10 may determine the distortion components in the face of other phase and distortion products along the path.

In some implementations, correction process 10 may use multiple Unit Test Periods (UTP) as a technique to time domain average the captured data and may make incremental improvements to the overall calculated parameters with respect to ideal. For instance, even in the MatLab simulation, the calculated parameters may change by as much as +/−3 degrees for phase products and +/−2 dB at −100 dB level for magnitude.

In some implementations, correction process 10 may operate as a circuit simulator model to verify the above process. For example, and referring at least to FIG. 17, a circuit simulator 1700, TINA, a spice like circuit modeling software package, is shown for example purposes only. In the example, the simulation includes the addition of a second and third harmonic, VG3 & VG5 respectively, of an input tone at a frequency of 1 kHz and an amplitude of 1 Vpk (1.41 Vrms), VG1. Its associated differential signal VG2, VG4, VG6 may carry the same magnitude with an 180° phase delta from its complimentary signal VG1, VG3, VG5. In some implementations, programming a phase of 90° for the signal source may result in a measured phase of that respective signal of 0°. Correction process 10 may account for this when verifying the phase relationship.

Figure 18:
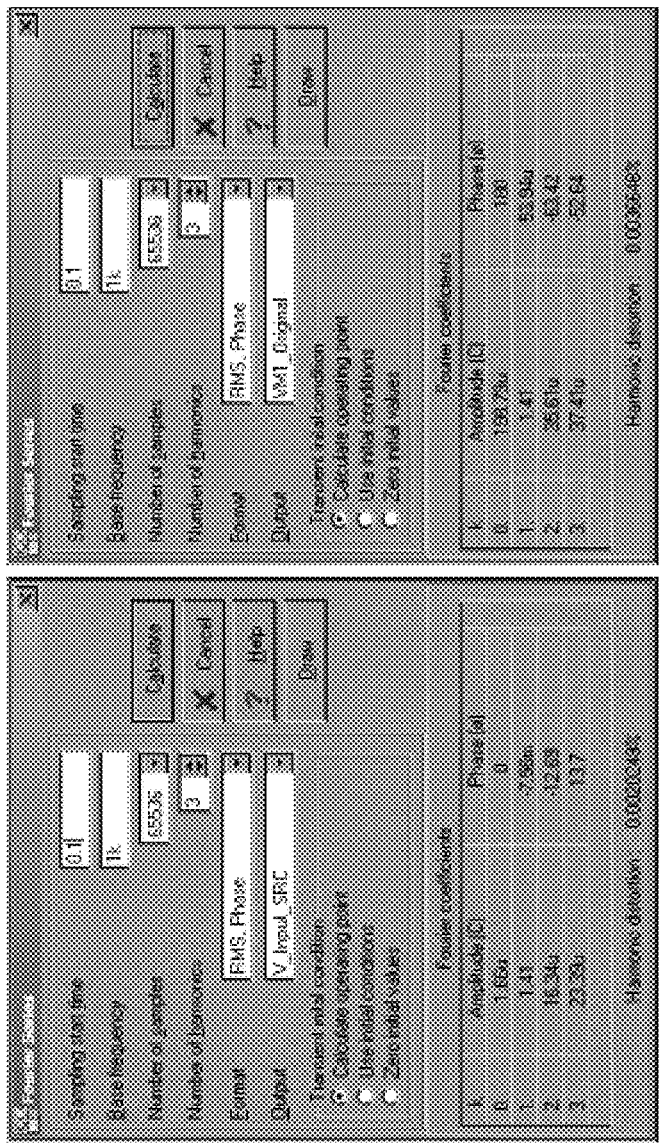
FIG. 18 is an illustrative diagrammatic view of a screen image displayed by the correction process according to one or more implementations of the present disclosure.

Referring at least to FIG. 18, example VM1 simulation results 1800 are shown. The example results of may represent the simulated input stimulus along with its respective distortion components, V_Input_SRC, as well as its simulated response through the associated signal path, VM1_Original.

Figure 19:
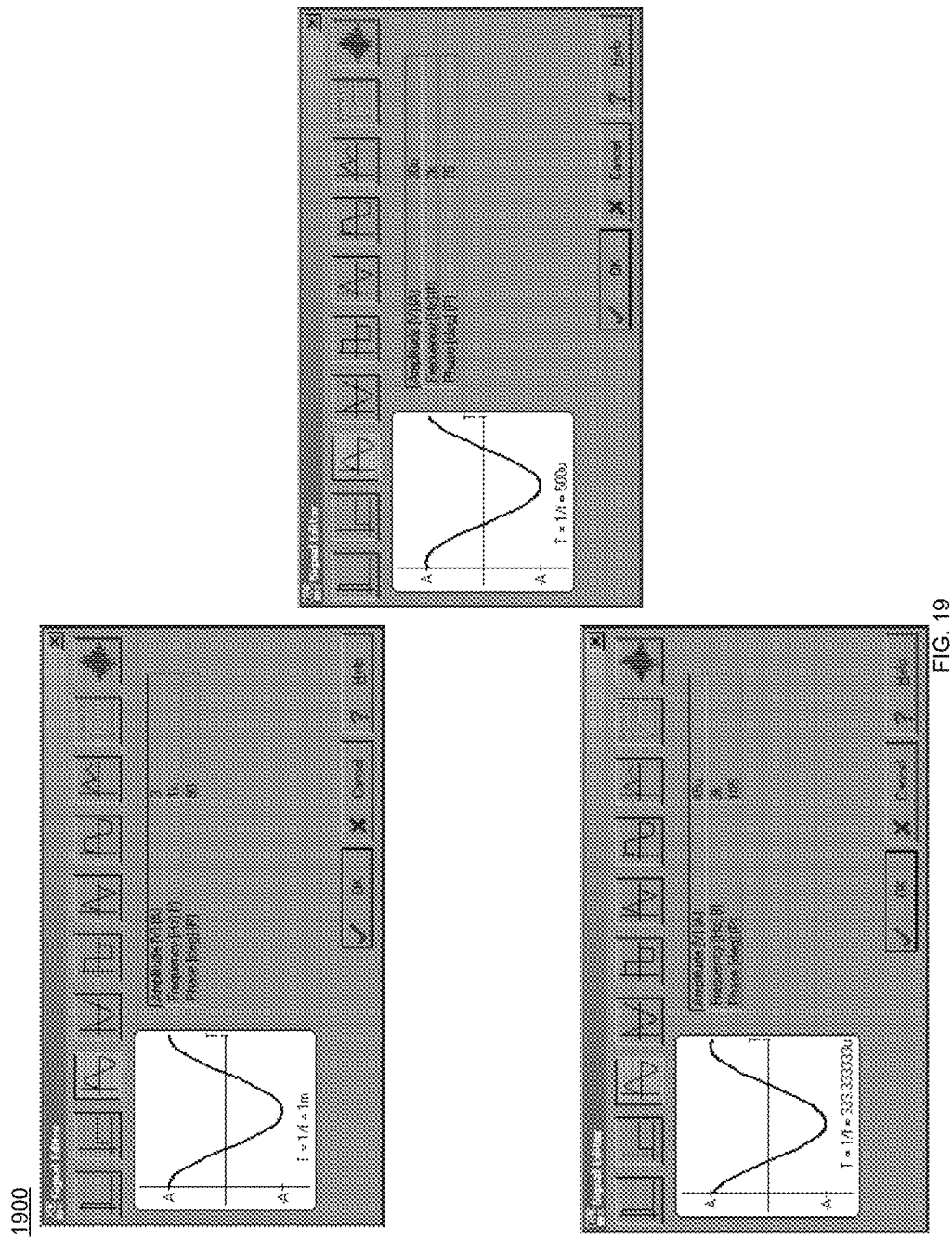
FIG. 19 is an illustrative diagrammatic view of a screen image displayed by the correction process according to one or more implementations of the present disclosure.

Referring at least to FIG. 19, an initial distortion setup 1900 of VG1, VG3, VG5 is shown. FIG. 19 shows the individual distortion products along with the fundamental signal, where the programmed magnitude (Vpk) and phase is shown. These three signals may then be summed together by correction process 10 via an attenuation network consisting of, e.g., three of the same size resistors. As such, the correlation of these programmed values, to that of the simulated response of FIG. 17 V_Input_SRC, is to divide the programmed amplitude by 3 and multiply by √2 to get to "rms" units, and as for phase, subtract 90° from the programmed value. That is:

Programmed Ideal Input/Simulated Measured Result respectively:

Mag. = 3 V/3*√2 = 1.41 Vrms            Phase = 90° − 90° = 0°
Mag. = 1.41 Vrms                        Phase = −0.00756°
Mag. = 30 uV/3*√2 = 14.14 uVrms         Phase = 75° − 90° = −15°
Mag. = 16.34 uVrms                      Phase = −12.69°
Mag. = 45 uV/3*√2 = 21.21 uVrms         Phase = 105° − 90° = 15°
Mag. = 23.39 uVrms                      Phase = 13.7°

Figure 20:
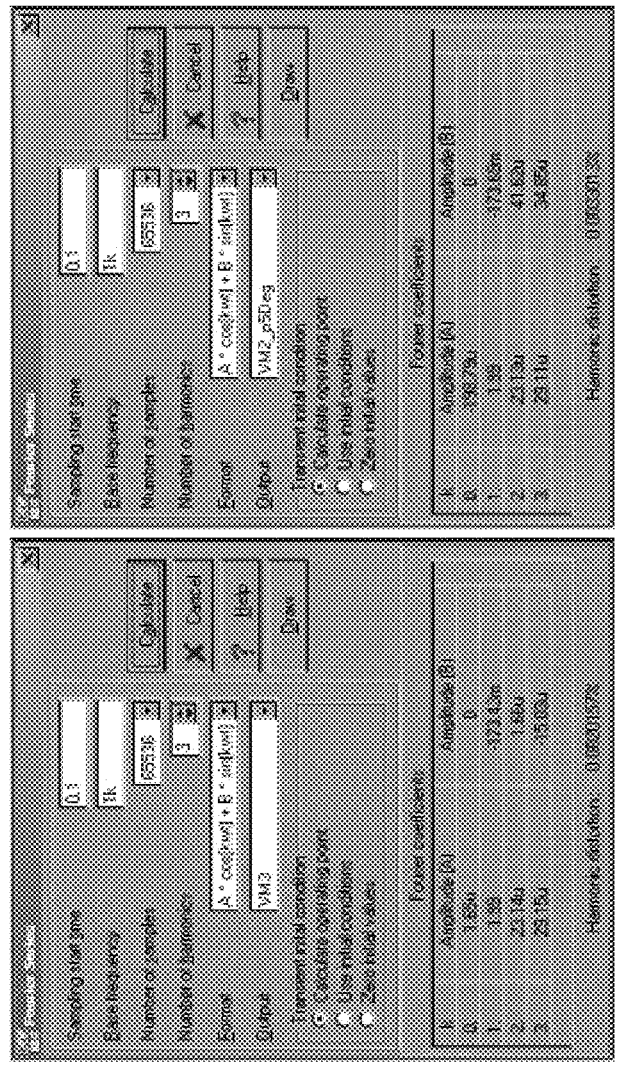
FIG. 20 is an illustrative diagrammatic view of a screen image displayed by the correction process according to one or more implementations of the present disclosure.

Referring at least to FIG. 20, the simulation 2000 of the fundamental phase shifted input source, as well as the measured output in Cartesian coordinates, is shown. Consistent with the above described process of correction process 10, the simulation model for the input source fundamental is shifted by some amount of phase according to the resource capability and frequency, +5°.

Figure 21:
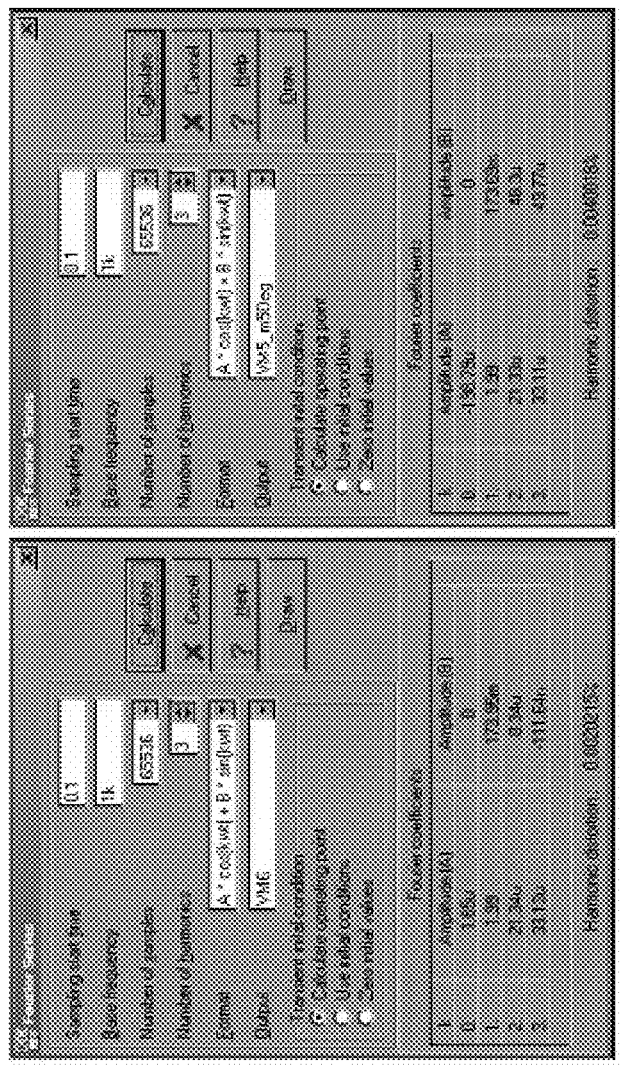
FIG. 21 is an illustrative diagrammatic view of a screen image displayed by the correction process according to one or more implementations of the present disclosure.

Referring at least to FIG. 21, the simulation 2100 of the fundamental phase shifted input source, as well as the measured output in Cartesian coordinates, is shown. Consistent with the above described process of correction process 10, the simulation model for the input source fundamental is then shifted by some amount of phase according to the resource capability and frequency, −5°. Correction process 10 may then solve for distortion Products using the above example:
(All Values Measured in Vpk)

Measured Result (VM2 p5 Deg): +5° Phase shift of the Fundamental
2nd Harmonic: 23.13u+i41.62u
3rd Harmonic: 29.11u+i34.85u Measured Result (VM5 m5 Deg): −5° Phase shift of the Fundamental
2nd Harmonic: 21.33u+i48.30u
3rd Harmonic: 33.11u+i49.77u Difference of Measured Results:
ΔV2nd_Harm=23.13u+i41.62u−(21.33u+i48.30u)=1.8u −i6.68u
ΔV3rd_Harm=29.11u+i34.85u−(33.11u+i49.77u)=−4u− i14.92u Converting to Polar Coordinates:
ΔV2nd_Harm=6.92u@−74.92°
ΔV3rd_Harm=15.45u@74.99°
Applying Correction Algorithm:
Calculated Source distortion Results:
ΔV2nd_Harm=6.92u@−74.92°
ΔV3rd_Harm=15.45u@74.99°
Proposed Calculation Method/Algorithm: (Vrms) $\Psi_H$=90°−Meas. Phase.
Note: (Meas. Phase=Prog. Phase −90°)

Phase2nd_Harm =
$$(90° - (-74.92°)) = 164.92° - 180°(\text{bound by} +/- 90°) = -15.08°$$

Phase3rd_Harm = $(90° - (74.99°)) = 15.01°$

VSRC_Harm_2nd =
$$\frac{(\Delta V_{2nd\_Harm}/2\sqrt{2})}{\text{Sin}(\Psi_H)\text{Sin}(\Delta_H)} \frac{R_5}{R_6} = \frac{(6.92u\,V_{pk}/2\sqrt{2})}{\text{Sin}(74.92)\text{Sin}(10°)}\left(\frac{1k}{1k}\right) = 14.59u\text{ Vrms}$$

$$\text{VSRC\_Harm\_3rd} = \frac{(\Delta V_{3rd\_Harm}/2\sqrt{2})}{\text{Sin}(\Psi_H)\text{Sin}(\Delta_H)} \frac{R_5}{R_6} =$$
$$\frac{(15.45u\,V_{pk}/2\sqrt{2})}{\text{Sin}(105.01)\text{Sin}(15°)}\left(\frac{1k}{1k}\right) = 21.85u\text{ Vrms}$$

Simulated Error: with respect to the programmed ideal input values:

| Magnitude: | Phase: |
|---|---|
| 2nd: (14.14 − 14.59)uVrms = −0.45 u ≈ 0.3 ppm | 2nd: −15 − (−15.08) = 0.08° |
| 3rd: (21.21 − 21.85)uVrms = −0.64 u ≈ 0.3 ppm | 3rd: 15 − 15.01 = 0.01° |

The terminology used herein is for the purpose of describing particular implementations only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps (not necessarily in a particular order), operations, elements, and/or components, but do not preclude the presence or addition of one or more other features, integers, steps (not necessarily in a particular order), operations, elements, components, and/or groups thereof.

The corresponding structures, materials, acts, and equivalents of all means or step plus function elements that may be in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications, variations, and any combinations thereof will be apparent to those of ordinary skill in the art without departing from the scope and spirit of the disclosure. The implementation(s) were chosen and described in order to best explain the principles of the disclosure and the practical application, and to enable others of ordinary skill in the art to understand the disclosure for various implementation(s) with various modifications and/or any combinations of implementation(s) as are suited to the particular use contemplated.

Having thus described the disclosure of the present application in detail and by reference to implementation(s) thereof, it will be apparent that modifications, variations, and any combinations of implementation(s) (including any modifications, variations, and combinations thereof) are possible without departing from the scope of the disclosure defined in the appended claims.

What is claimed is:

1. A computer-implemented method for determining a magnitude and phase of a distortion component comprising:
receiving, by a computing device, a first signal and a second signal from a first source operatively connected to a differential component;
nulling a first output associated with the first signal and a second output associated with the second signal;
shorting the first signal and the second signal;
disconnecting a second source operatively connected to the differential component;
applying the first signal of the first source at a same phase as the second source with an additional phase delta, $+Y°$;
measuring a first differential residual signal using the first signal at the same phase as the second source with the additional phase delta, $+Y°$;
applying the second signal of the first source at the same phase as the second source with an additional phase delta, $-Y°$;
measuring a second differential residual signal using the second signal at the same phase as the second source with the additional phase delta $-Y°$; and
determining the magnitude and phase of the distortion component of the first source based upon, at least in part, the first and second differential residual signal.

2. The computer-implemented method of claim 1 wherein at least one of the first source and the second source are at least one of a true differential, a pseudo differential, and a single ended configuration.

3. The computer-implemented method of claim 1 wherein the second source is disconnected by opening one or more relays.

4. The computer-implemented method of claim 1 wherein the first signal and the second signal are shorted by closing one or more relays.

5. The computer-implemented method of claim 1 wherein nulling the first output and the second output includes setting an amplitude of the first signal and the second signal relative to an amplitude of the second source.

6. The computer-implemented method of claim 1 wherein the magnitude of the distortion component remain constant while the phase of the distortion component move according to its position with respect to the second signal.

7. The computer-implemented method of claim 1 wherein the magnitude and phase of the distortion component are determined without a notch filter.

8. The computer-implemented method of claim 1 wherein at least one of the first source and the second source may include at least one of an input source and a nulling source.

9. A computer program product residing on a computer readable storage medium having a plurality of instructions stored thereon which, when executed by a processor, cause the processor to perform operations for determining a magnitude and phase of a distortion component comprising:
receiving a first signal and a second signal from a first source operatively connected to a differential component;
nulling a first output associated with the first signal and a second output associated with the second signal;
shorting the first signal and the second signal;
disconnecting a second source operatively connected to the differential component;
applying the first signal of the first source at a same phase as the second source with an additional phase delta, $+Y°$;
measuring a first differential residual signal using the first signal at the same phase as the second source with the additional phase delta, $+Y°$;
applying the second signal of the first source at the same phase as the second source with an additional phase delta, $-Y°$;
measuring a second differential residual signal using the second signal at the same phase as the second source with the additional phase delta $-Y°$; and
determining the magnitude and phase of the distortion component of the first source based upon, at least in part, the first and second differential residual signal.

10. The computer program product of claim 9 wherein the input source and the nulling source are true differential.

11. The computer program product of claim 9 wherein the second source is disconnected by opening one or more relays.

12. The computer program product of claim 9 wherein the first signal and the second signal are shorted by closing one or more relays.

13. The computer program product of claim 9 wherein nulling the first output and the second output includes setting an amplitude of the first signal and the second signal relative to an amplitude of the second source.

14. The computer program product of claim 9 wherein the magnitude of the spurious-free dynamic range component remain constant while the phase of the spurious-free dynamic range component move according to its position with respect to the second signal.

15. The computer program product of claim 9 wherein the magnitude and phase of the spurious-free dynamic range component are determined without a notch filter.

16. The computer program product of claim 9 wherein at least one of the first source and the second source may include at least one of an input source and a nulling source.

17. A computing system including a processor and a memory configured to perform operations for determining a magnitude and phase of a distortion component comprising:
receiving a first signal and a second signal from a first source operatively connected to a differential component;
nulling a first output associated with the first signal and a second output associated with the second signal;
shorting the first signal and the second signal;
disconnecting a second source operatively connected to the differential component;
applying the first signal of the first source at a same phase as the second source with an additional phase delta, $+Y°$;
measuring a first differential residual signal using the first signal at the same phase as the second source with the additional phase delta, $+Y°$;
applying the second signal of the first source at the same phase as the second source with an additional phase delta, $-Y°$;
measuring a second differential residual signal using the second signal at the same phase as the second source with the additional phase delta $-Y°$; and
determining the magnitude and phase of the distortion component of the first source based upon, at least in part, the first and second differential residual signal.

18. The computing system of claim 17 wherein the input source and the nulling source are true differential.

19. The computing system of claim 17 wherein the second source is disconnected by opening one or more relays.

20. The computing system of claim 17 wherein the first signal and the second signal are shorted by closing one or more relays.

21. The computing system of claim 17 wherein nulling the first output and the second output includes setting an amplitude of the first signal and the second signal relative to an amplitude of the second source.

22. The computing system of claim 17 wherein the magnitude of the spurious-free dynamic range component remain constant while the phase of the spurious-free dynamic range component move according to its position with respect to the second signal.

23. The computing system of claim 17 wherein the magnitude and phase of the spurious-free dynamic range component are determined without a notch filter.

24. The computing system of claim 17 wherein at least one of the first source and the second source may include at least one of an input source and a nulling source.

* * * * *